(12) United States Patent
Li

(10) Patent No.: US 9,381,733 B1
(45) Date of Patent: Jul. 5, 2016

(54) PREPARATION METHOD OF PRINTING PLATE FOR ALIGNMENT FILM

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Hongpeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/740,899

(22) Filed: Jun. 16, 2015

(30) Foreign Application Priority Data

Feb. 3, 2015 (CN) .......................... 2015 1 0055765

(51) Int. Cl.
*G03F 7/038* (2006.01)
*B41C 1/055* (2006.01)

(52) U.S. Cl.
CPC .............. *B41C 1/055* (2013.01); *G03F 7/0385* (2013.01)

(58) Field of Classification Search
CPC ..................................................... G03F 7/0385
See application file for complete search history.

(56) References Cited

U.S. PATENT DOCUMENTS

| | | | | |
|---|---|---|---|---|
| 8,802,792 | B2* | 8/2014 | Carlson | C08G 18/6795 525/523 |
| 2012/0060711 | A1* | 3/2012 | Rudolph | G02F 1/133711 101/451 |
| 2015/0232757 | A1* | 8/2015 | Kaneoya | C09K 19/3001 349/89 |
| 2015/0252227 | A1* | 9/2015 | Zajaczkowski | C09J 4/06 522/6 |

* cited by examiner

*Primary Examiner* — Joshua D Zimmerman
(74) *Attorney, Agent, or Firm* — Kinney & Lange, P.A.

(57) ABSTRACT

The invention relates to the technical field of fabricating a display device, and specifically, to a preparation method of a printing plate for alignment film. The method comprises the following steps of: mixing 40-70 parts by mass of a resin for a printing plate for alignment film, 10-20 parts by mass of an epoxy acrylic resin, 10-20 parts by mass of a photoinitiator, and 20-30 parts by mass of a peroxide initiator, and then coating on a surface of a substrate; exposing with an ultraviolet ray and developing; and subjecting the exposed and developed substrate to a thermal curing process. According to the above technical solution, by adding a peroxide initiator, and adding a thermal curing process after the printing plate for alignment film is exposed during the process for preparing the printing plate for alignment film, the reaction rate of carbon-carbon double bonds is improved, and thereby the resistance of the printing plate for alignment film to a PI liquid having a high polarity is improved and the incidence rate of foreign substance is reduced.

18 Claims, 2 Drawing Sheets

Exposing    Thermal curing    Washing

Exposing    Thermal curing    Washing

PREPARATION METHOD OF PRINTING PLATE FOR ALIGNMENT FILM

TECHNICAL FIELD

This disclosure relates to the technical field of fabricating a display device, and specifically, to a preparation method of a printing plate for alignment film.

BACKGROUND

The traditional printing plate for alignment film utilizes a single polyurethane acrylic resin, and when exposing, both sides thereof are exposed so as to strengthen the strength and toughness of the printing plate for alignment film. However, because the ingredient of a polar solvent in a PI liquid (a chemical liquid for preparing an alignment film) becomes more and more recently, the polyurethane acrylic resin is swelled in the presence of the strongly polar solvent, and during PI transferring, the resin ingredient of the printing plate for alignment film will fall onto the substrate and form foreign substance. In order to improve the resistance ability of the printing plate for alignment film when used together with a strongly polar PI liquid, the most effective method is to increase the cross-linking strength of the resin for the printing plate for alignment film. The traditional material for the printing plate for alignment film is mainly PUA resin (a polyurethane acrylic resin) which fully depends on the result of cross-linking formed upon exposure. Being restricted by the intrinsic characteristics and UV cross-linking characteristics of PUA resin, the reaction rate of the carbon-carbon double bonds is generally about 80%.

SUMMARY

The disclosure provides a preparation method of a printing plate for alignment film, useful for improving the resistance ability of the printing plate for alignment film when used together with a strongly polar PI liquid.

The disclosure provides a preparation method of a printing plate for alignment film, comprising the following steps of:

mixing 40-70 parts by mass of a resin for a printing plate for alignment film, 10-20 parts by mass of an epoxy acrylic resin, 10-20 parts by mass of a photoinitiator, and 20-30 parts by mass of a peroxide initiator, and then coating on a surface of a substrate;

exposing with an ultraviolet ray and developing; and subjecting the exposed and developed substrate to a thermal curing process.

According to the above technical solution, during the process for preparing a printing plate for alignment film, by adding a peroxide initiator, and adding a thermal curing process after the printing plate for alignment film is exposed, the reaction rate of the carbon-carbon double bonds is improved, and thereby the resistance of the printing plate for alignment film to a PI liquid having a high polarity is improved and the incidence rate of foreign substance is reduced.

DETAILED DESCRIPTION

Figure 1:
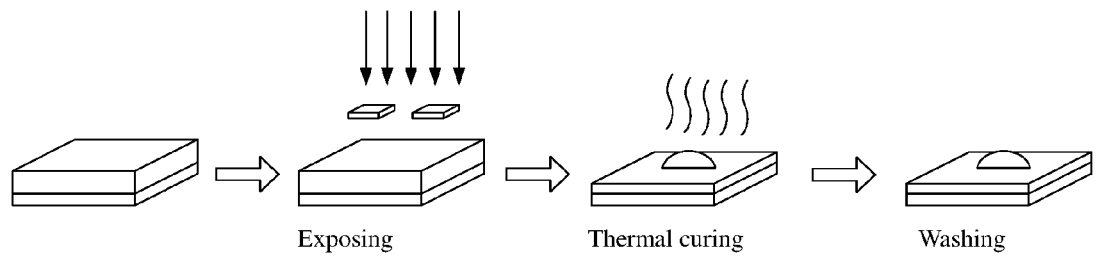
FIG. 1 is a flow chart of the preparation method of a printing plate for alignment film provided in an example of the disclosure.

In order to improve the resistance ability of the printing plate for alignment film when used together with a strongly polar PI liquid and reduce the incidence rate of foreign substance, this disclosure provides a preparation method of a printing plate for alignment film. In the method according to the application, by the preparation process comprising exposing with an ultraviolet ray and high-temperature heating, the binding rate of the carbon-carbon double bonds is increased, and thereby the resistance ability of the printing plate for alignment film when used together with a strongly polar PI liquid is improved and the incidence rate of foreign substance is reduced.

Specifically, the disclosure provides a preparation method of a printing plate for alignment film, comprising the following steps of:

mixing 40-70 parts by mass of a resin for a printing plate for alignment film, 10-20 parts by mass of an epoxy acrylic resin, 10-20 parts by mass of a photoinitiator, and 20-30 parts by mass of a peroxide initiator, and then coating on a surface of a substrate;

exposing with an ultraviolet ray and developing; and subjecting the exposed and developed substrate to a thermal curing process.

In some embodiments, preferably, the method further comprises washing the substrate after the thermal curing process is completed.

Preferably, said washing the substrate comprises washing the substrate by using N, N-dimethylformamide as a washing liquid.

In some embodiments, the resin for a printing plate for alignment film in the disclosure is a resin for a printing plate for alignment film having a main ingredient of PUA resin, for example, a resin K11 for a printing plate for alignment film, provided by Asahi Kasei from Japan.

In some embodiments, the epoxy acrylic resin in the disclosure is a mixture of:

a polymer of the following formula:

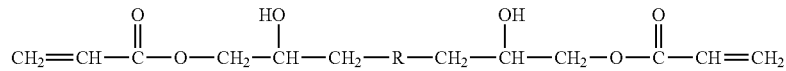

wherein R is

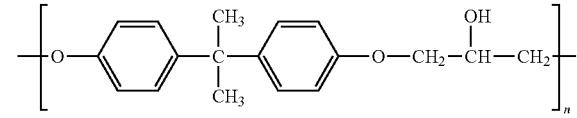

and n is a positive integer less than or equal to 1200; and an epoxy resin of the following formula:

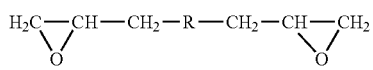

wherein the structure of R is the same as above.

In some embodiments, the substrate in the disclosure is a resin substrate, such as a polyester resin substrate. The polyester resin comprises a polyethylene terephthalate resin, a polyethylene naphthalate resin and the like.

In the disclosure, preferably, the step of exposing with an ultraviolet ray and developing comprises:

performing the exposure by irradiating with an ultraviolet ray having a wavelength of 265 nm or 350 nm.

The illuminance of the ultraviolet ray may be 7 J.

In the disclosure, preferably, the photoinitiator has a main absorbing region of from 350 to 400 nm.

Preferably, the photoinitiator is photoinitiator No. 819 produced by Shanghai Kaiyin Chemical Industry.

In the disclosure, preferably, the peroxide initiator comprises benzoyl peroxide or methyl ethyl ketone peroxide.

In some embodiments, preferably, the thermal curing process is performed under the condition of 150° C. for 2 hr.

In some embodiments, preferably, the step of mixing 40-70 parts by mass of a resin for a printing plate for alignment film, 10-20 parts by mass of an epoxy acrylic resin, 10-20 parts by mass of a photoinitiator, and 20-30 parts by mass of a peroxide initiator, and then coating on a surface of a substrate specifically comprises:

mixing 50 part by mass of the resin for a printing plate for alignment film, 10 part by mass of the epoxy acrylic resin, 10 part by mass of the photoinitiator, and 30 parts by mass of the peroxide initiator, and then coating on a surface of a polyethylene terephthalate resin substrate.

According to the above technical solutions, during the process for preparing a printing plate for alignment film, by adding a peroxide initiator, and adding a thermal curing process after the printing plate for alignment film is exposed, the reaction rate of the carbon-carbon double bonds is increased (in certain embodiments, up to about 95%), and thereby the resistance of the printing plate for alignment film to a strong polar PI liquid is improved and the incidence rate of foreign substance is reduced.

Examples

In order to illustrate the object, technical solutions and advantages of the disclosure more clearly, the disclosure is further demonstrated in details below with reference to the examples having no limiting purpose.

FIG. 1 is a flow chart of the preparation method of a printing plate for alignment film provided in an example of the disclosure. As shown in FIG. 1, this example provides a preparation method of a printing plate for alignment film, comprising the following steps of:

mixing 40-70 parts by mass of a resin K11 for a printing plate for alignment film (available from Asahi Kasei, Japan), 10-20 parts by mass of an epoxy acrylic resin, 10-20 parts by mass of a photoinitiator, and 20-30 parts by mass of a peroxide initiator, and the coating on a surface of a polyethylene terephthalate resin substrate;

exposing with an ultraviolet ray and developing; and subjecting the exposed and developed substrate to a thermal curing process.

In the above example, during the process for preparing a printing plate for alignment film, by adding a peroxide initiator, and adding a thermal curing process after the printing plate for alignment film is exposed, the reaction rate of the carbon-carbon double bonds is increased to about 95%, and thereby the resistance of the printing plate for alignment film to a strong polar PI liquid is improved and the foreign substance are reduced.

For the sake of the better understanding about the preparation method of a printing plate for alignment film provided in the example, it is described in details below with reference to FIG. 1.

Step I: Mixing 40-70 parts by mass of a resin K11 for a printing plate for alignment film, 10-20 parts by mass of an epoxy acrylic resin, 10-20 parts by mass of a photoinitiator, and 20-30 parts by mass of a peroxide initiator and the coating on a surface of a polyethylene terephthalate resin substrate.

Specifically, the ratio of the ingredients can be varied, for example, the part by mass of the resin K11 for a printing plate for alignment film (whose main ingredient is PUA resin) may be any one between 40 and 70, such as 40, 50, 60, 70 or the like; the part by mass of the epoxy acrylic resin may be any one between 10 and 20, such as 10, 15, 20 or the like; the part by mass of the photoinitiator may be any one between 10 and 20, such as 10, 15, 20 or the like; and the part by mass of the peroxide initiator may be any one between 20 and 30, such as 20, 25, 30 or the like. Preferably, the parts of mass of the above ingredients are: 50 parts by mass of a resin for a printing plate for alignment film, 10 parts by mass of an epoxy acrylic resin, 10 parts by mass of a photoinitiator, and 30 parts by mass of a peroxide initiator.

The above ingredients are mixed and coated on a surface of a polyethylene terephthalate resin substrate, and the organic solvent is evaporated in a vacuum environment for 2-3 hr.

The epoxy acrylic resin therein is a mixture of:

a polymer of the following formula:

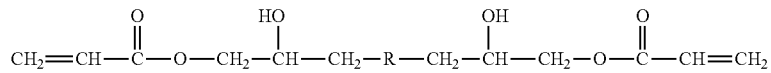

wherein R is

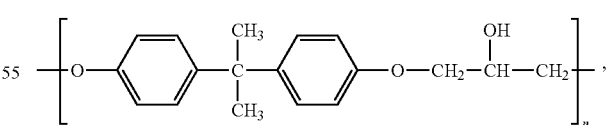

and n is a positive integer less than or equal to 1200; and an epoxy resin of the following formula:

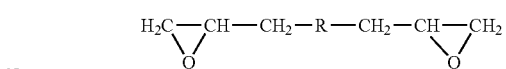

wherein the structure of R is the same as above.

The photoinitiator therein has an absorbing wavelength in a region of from 350 to 400 nm. Preferably, the photoinitiator is photoinitiator No. 819 (2,4,6-trimethylbenzoyl phosphine oxide, available from Shanghai Kaiyin Chemical Industry).

The peroxide initiator therein is benzoyl peroxide or methyl ethyl ketone peroxide.

Step II. Exposing with an ultraviolet ray and developing;

Specifically, the exposure is performed by irradiating an ultraviolet ray having a wavelength of 265 nm or 350 nm and an illuminance of 7 J. The wavelength values correspond to the photoinitiator added. The photoinitiator No. 819 has corresponding absorbing peaks at 265 nm and 350 nm.

Step III. Subjecting the exposed and developed substrate to a thermal curing process.

Specifically, during the thermal curing process, the condition of the thermal curing process is 150° C. for 2 hr.

Step IV. After the thermal curing process is completed, the method further comprises washing the substrate Specifically, the substrate is washed by using N,N-dimethylformamide as a washing liquid.

Figure 2:
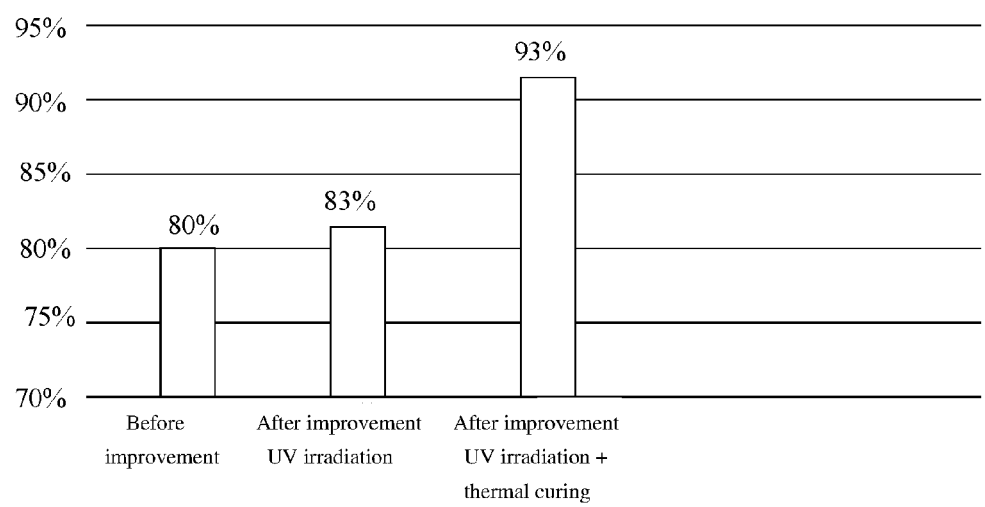
FIG. 2 is a chart for comparing the conversion of carbon-carbon double bonds in a printing plate for alignment film provided in the examples of the disclosure.

The fabrication of the printing plate for alignment film is completed by the above steps. As seen from FIG. 2, before the improvement, that is, in the traditional resin for a printing plate for alignment film, the conversion of carbon-carbon double bonds is only about 80%, After the improvement, the PUA resin and the epoxy acrylic resin are cross-linked to each other during the exposing process, to form a cross-linking structure, but the conversion of carbon-carbon double bonds cannot reach a higher level merely by means of exposure, because as the reaction progresses, the viscosity of the resin becomes higher, and the reaction rate of the photoinitiator decreases gradually. Accordingly, in the method of the application, a thermal curing step is added. In the thermal curing process, the peroxide initiator forms thermal free radicals under the condition of heating. Because of the presence of the high temperature environment, the average free path of the free radical in the resin becomes higher, which allows the further reaction of unreacted carbon-carbon double bonds so as to increase the reaction rate. Furthermore, due to the presence of epoxy groups, the cross-linking degree of the finally obtained printing plate for alignment film is improved, and thus, the resistance of the product to a strong polar PI liquid is improved.

Figure 3:
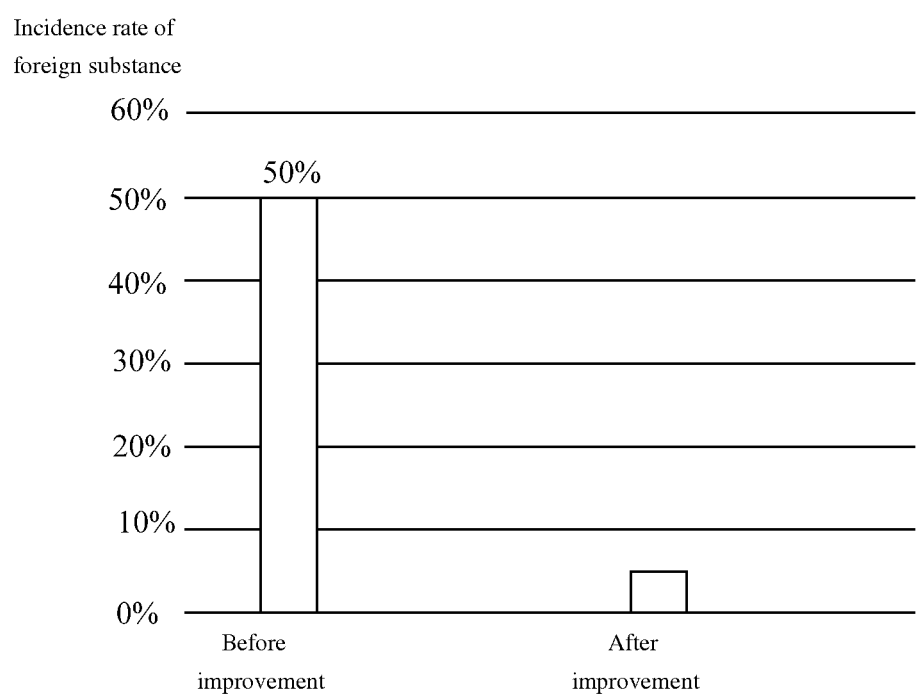
FIG. 3 is a chart for comparing the incidence rate of foreign substance in a printing plate for alignment film provided in the examples of the disclosure.

Referring to FIG. 3, as compared with the traditional process for preparing a printing plate for alignment film, the preparation method of a printing plate for alignment film of the disclosure further improves the cross-linking degree of the resin, by adding a peroxide initiator into the resin, and adding a thermal curing process after the curing with an ultraviolet ray. In this way, the strength of the finally obtained printing plate for alignment film is improved, as a result, in the process of long-term application, the weathering resistance of the printing plate for alignment film to a PI liquid is improved, and during the process of PI transferring, the ingredient of the printing plate for alignment film will not fall onto the substrate of the liquid crystal panel, and thus, the incidence rate of foreign substance is obviously reduced.

Obviously, those skilled in the art can carry out various modifications and variations to the disclosure, without departing the spirit and scope of the disclosure. Thus, if these modifications and variations of the disclosure belong to the scope of the claims of the application and the equivalent technology, it is intended that this disclosure also comprises these modifications and variations.

The invention claimed is:

1. A preparation method of a printing plate for alignment film, comprising:

mixing 40-70 parts by mass of a resin for the printing plate for alignment film, 10-20 parts by mass of an epoxy acrylic resin, 10-20 parts by mass of a photoinitiator, and 20-30 parts by mass of a peroxide initiator to form a mixture, and then coating the mixture on a surface of a substrate;

exposing the substrate with an ultraviolet ray and developing the substrate; and subjecting the exposed and developed substrate to a thermal curing process, wherein the epoxy acrylic resin is a mixture of:

a polymer of the following formula:

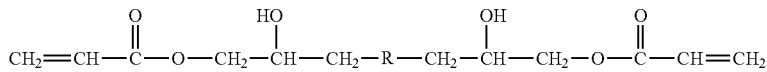

wherein R is

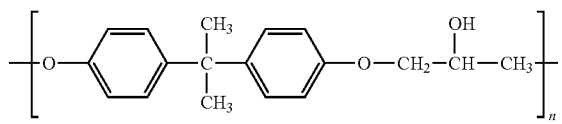

and n is a positive integer less than or equal to 1200; and an epoxy resin of the following formula:

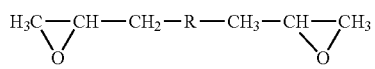

wherein the structure of R is the same as above.

2. The preparation method of the printing plate for alignment film according to claim 1, wherein the method further comprises washing the substrate, after the thermal curing process is completed.

3. The preparation method of the printing plate for alignment film according to claim 2, wherein said washing the substrate comprises washing the substrate by using N, N-dimethylformamide as a washing liquid.

4. The preparation method of the printing plate for alignment film according to claim 1, wherein the resin for the printing plate for alignment film contains a polyurethane acrylic resin as a main ingredient.

5. The preparation method of the printing plate for alignment film according to claim 1, wherein the substrate is a resin substrate.

6. The preparation method of the printing plate for alignment film according to claim 5, wherein the resin substrate is a polyester resin substrate.

7. The preparation method of the printing plate for alignment film according to claim 6, wherein the polyester resin comprises a polyethylene terephthalate resin and a polyethylene naphthalate resin.

8. The preparation method of the printing plate for alignment film according to claim 1, wherein said exposing the substrate with an ultraviolet ray and developing the substrate comprises:

performing the exposure by irradiating the substrate with an ultraviolet ray having a wavelength of 265 nm or 350 nm.

9. The preparation method of printing plate for alignment film according to claim 8, wherein an illuminance of the ultraviolet ray is 7 J.

10. The preparation method of printing plate for alignment film according to claim 1, wherein the photoinitiator has a main absorbing region of from 350 to 400 nm.

11. The preparation method of the printing plate for alignment film according to claim 10, wherein the photoinitiator comprises photoinitiator No. 819.

12. The preparation method of the printing plate for alignment film according to claim 1, wherein the peroxide initiator comprises benzoyl peroxide or methyl ethyl ketone peroxide.

13. The preparation method of printing plate for alignment film according to claim 2, wherein the peroxide initiator comprises benzoyl peroxide or methyl ethyl ketone peroxide.

14. The preparation method of printing plate for alignment film according to claim 4, wherein the peroxide initiator comprises benzoyl peroxide or methyl ethyl ketone peroxide.

15. The preparation method of the printing plate for alignment film according to claim 5, wherein the peroxide initiator comprises benzoyl peroxide or methyl ethyl ketone peroxide.

16. The preparation method of the printing plate for alignment film according to claim 9, wherein the peroxide initiator comprises benzoyl peroxide or methyl ethyl ketone peroxide.

17. The preparation method of the printing plate for alignment film according to claim 11, wherein the thermal curing process is performed under a condition of 140 to 150° C. for 2 to 2.5 hours.

18. The preparation method of the printing plate for alignment film according to claim 11, wherein the substrate comprises a polyethylene terephthalate resin substrate, and the step of mixing 40-70 parts by mass of a resin for the printing plate for alignment film, 10-20 parts by mass of an epoxy acrylic resin, 10-20 parts by mass of a photoinitiator, and 20-30 parts by mass of a peroxide initiator to form the mixture, and then coating the mixture on the surface of the polyethylene terephthalate resin substrate comprises:

mixing 50 parts by mass of the resin for the printing plate for alignment film, 10 parts by mass of the epoxy acrylic resin, 10 parts by mass of the photoinitiator, and 30 parts by mass of the peroxide initiator to form the mixture, and then coating the mixture on the surface of the polyethylene terephthalate resin substrate.

* * * * *